US012581972B2

(12) United States Patent
Lim et al.

(10) Patent No.: US 12,581,972 B2
(45) Date of Patent: Mar. 17, 2026

(54) ELECTRICALLY CONDUCTIVE STRIPS ON A SIDE OF A MEMORY MODULE

(71) Applicant: Intel Corporation, Santa Clara, CA (US)

(72) Inventors: Min Suet Lim, Gelugor (MY); Kavitha Nagarajan, Bangalore (IN); Eng Huat Goh, Ayer Itam (MY); Telesphor Kamgaing, Chandler, AZ (US)

(73) Assignee: intel Corporation, Santa Clara, CA (US)

( * ) Notice: Subject to any disclaimer, the term of this patent is extended or adjusted under 35 U.S.C. 154(b) by 739 days.

(21) Appl. No.: 17/848,607

(22) Filed: Jun. 24, 2022

(65) Prior Publication Data

US 2023/0420342 A1    Dec. 28, 2023

(51) Int. Cl.
| | |
|---|---|
| *H01L 23/498* | (2006.01) |
| *H01L 21/48* | (2006.01) |
| *H01L 25/065* | (2023.01) |
| *H01L 25/10* | (2006.01) |

(52) U.S. Cl.
CPC .... *H01L 23/49805* (2013.01); *H01L 21/4853* (2013.01); *H01L 25/0657* (2013.01); *H01L 25/105* (2013.01); *H01L 2225/0651* (2013.01); *H01L 2225/0652* (2013.01)

(58) Field of Classification Search
CPC ........... H01L 23/49805; H01L 21/4853; H01L 25/0657; H01L 25/105; H01L 2225/0651; H01L 2225/0652; H01L 23/49838; H01L 23/50; H01L 23/585; H01L 2225/06517; H01L 25/18
See application file for complete search history.

(56) References Cited

U.S. PATENT DOCUMENTS

| | | | | |
|---|---|---|---|---|
| 5,847,929 A | * | 12/1998 | Bernier | H01L 23/367 |
| | | | | 257/E23.09 |
| 5,933,712 A | * | 8/1999 | Bernhardt | H01L 23/5387 |
| | | | | 438/109 |
| 6,420,789 B1 | * | 7/2002 | Tay | H05K 1/181 |
| | | | | 257/676 |
| 6,441,493 B1 | * | 8/2002 | Kim | H01L 23/49838 |
| | | | | 257/781 |
| 6,737,738 B2 | * | 5/2004 | Koh | G11C 5/04 |
| | | | | 257/730 |
| 6,836,007 B2 | * | 12/2004 | Michii | H01L 23/3114 |
| | | | | 257/691 |
| 6,929,976 B2 | * | 8/2005 | Chan | H01L 25/03 |
| | | | | 438/106 |

* cited by examiner

*Primary Examiner* — Thienvu V Tran
*Assistant Examiner* — Muaamar Qahtan Al-Taweel
(74) *Attorney, Agent, or Firm* — Schwabe, Williamson & Wyatt, P.C.

(57) ABSTRACT

Embodiments herein relate to systems, apparatuses, or processes for creating packages that include one or more memory modules with electrically conductive strips on the side of the memory module to route power or provide a ground to multiple BGA contacts on a side of the memory module coupled with a substrate. Providing power and/or ground in this manner enables fewer layers to be used in a substrate that are no longer needed to be routed in the power plane on the substrate, thus reducing a Z-height of the package. Other embodiments may be described and/or claimed.

25 Claims, 12 Drawing Sheets

180

| LEVEL NUMBER | NAME | POWER RAILS |
|---|---|---|
| L01 | SURFACE | GND |
| L02 | 4F | DDR ROUTING 1 |
| L03 | 3F | GND |
| L04 | 2F | DDR ROUTING 2 |
| L05 | 1FCO | GND |
| L06 | 1BCO | VDD2H/VDD1P8 |
| L07 | 2B | GND |
| L08 | 3B | VDD2L/VDDQ |
| L09 | 4B | GND |
| L10 | BASE | VDD2H/VDD2L/VDDQ/VDD1P8 |

ELECTRICALLY CONDUCTIVE STRIPS ON A SIDE OF A MEMORY MODULE

FIELD

Embodiments of the present disclosure generally relate to the field of package assemblies, and in particular package assemblies that include dynamic random-access memory (DRAM) on a substrate.

BACKGROUND

Continued reduction in end product size of mobile electronic devices such as smart phones and ultrabooks is a driving force for the development of reduced size system in package components. In particular, reducing the height of packages that include DRAM modules.

BRIEF DESCRIPTION OF THE DRAWINGS

FIGS. 1A-1D illustrate top-down and cross section side views of various components of legacy packages that include one or more DRAM modules on a package substrate.

DETAILED DESCRIPTION

Figure 1A:
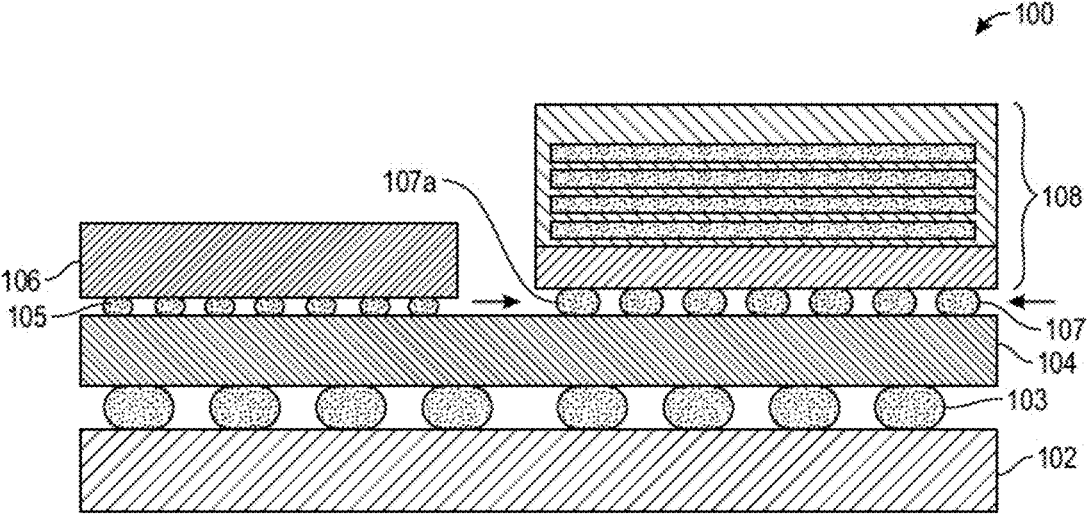
Figure 1A:
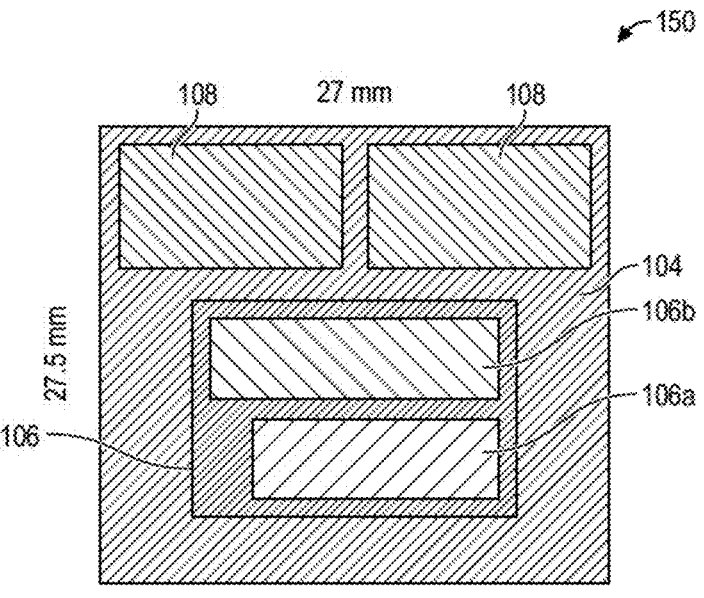

Embodiments of the present disclosure may generally relate to systems, apparatus, techniques, and/or processes directed to creating packages that include one or more memory modules, for example DRAM modules, that have electrically conductive strips, or rings, around or partially around the memory modules. In embodiments, the electrically conductive strips may be electrically coupled to a power or to a ground on a substrate. Each of the electrically conductive strips may be also electrically coupled with one or more electrical contacts, for example individual ball grid array (BGA) contacts, on the bottom of the memory module, where each of the individual BGA contacts are to be electrically coupled with the same power source or the same ground.

In embodiments, the electrically conductive strips may be used to route power and/or ground from a single BGA contact to multiple BGA contacts of the memory modules without having to provide multiple power and/or ground paths to the multiple BGA contacts of the memory modules through the substrate. In embodiments, because the substrate requires fewer layers for power planes for electrical routing, fewer layers of the substrate are required compared to legacy implementations.

In embodiments, the electrically conductive strips may include metal rings or copper tape. In embodiments, when a memory module is inserted onto the substrate, an electrically conductive strip on the side of the memory module may come into contact with a power source or a ground on the substrate, and may also come into contact with electrical connections on a surface of the substrate that electrically couple with one or more BGA contacts on the bottom of the memory module. In embodiments, this may provide each of those one or more BGA contacts with a power or ground. In embodiments, these electrical connections may be referred to as power rails. In embodiments, one or two electrically conductive strips may be used to route different types of power to the one or more BGA contacts.

In embodiments, the electrically conductive strips surrounding one or more memory modules may be used to route power to the one or more BGA contacts without having a separate power or ground routing path that goes through the substrate for each of the BGA contacts. In embodiments, this may result in fewer package substrate layers due to fewer package power planes being required in the substrate, thus resulting in an overall thinner package substrate. In embodiments, a thinner package substrate may yield a reduced Z-height for the package overall. Embodiments may also address global substrate capacity issues.

In embodiments that include two or more memory modules, a conductive bridge may be used to electrically couple a conductive strip on one memory module to a conductive strip on the other memory module. In embodiments, power that has a low current requirement may be preferentially connected through the electrically conductive strips. In addition, future designs of ball maps of memory modules may have low current power rails brought to edge rows of the memory modules.

To increase memory performance, memory modules are brought closer to a die or die complex coupled with the package substrate and electrically coupled with the memory modules. This may reduce the distance for signals traveling between the memory module and the die or die complex. In embodiments, the die complex may be a system on chip (SOC).

In legacy implementations, routing signal or power to and from a memory module is done within layers of a substrate on which the memory module is mounted. In particular, in these legacy implementations, power is supplied from the substrate through BGA contacts of the memory module from electrical connections with power planes within the substrate. In these legacy implementations, if all power rails within a memory module need to be accommodated within the package substrate, then the layer count of the substrate will increase. This will increase the Z-height due to more layers within the substrate, and more package real estate is needed along with other high current rails.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIGS. 1A-1D illustrate top-down and cross section side views of various components of legacy packages that include one or more memory modules on a package substrate. FIG. 1A shows a cross section side view 100 and a top-down view 150 of a legacy memory package that includes a PCB 102, onto which package substrate 104 may be attached. In implementations, a BGA 103 may be used to electrically and physically couple the package substrate 104 with the PCB 102.

In implementations, a die complex 106, which may include dies 106a, 106b, may be physically and electrically coupled with the package substrate 104 using BGA 105. One or more memory modules 108 may be physically and electrically coupled with the package substrate 104 using BGA 107. In implementations, the memory modules may be DRAM memory modules. In implementations, each of the BGA 107, such as individual BGA 107a, may be used to transmit signals, used to couple with different power sources which may be referred to as different power rails, or use for a ground connection between the package substrate 104 and the memory module 108. When attached to the package substrate 104, each of the BGA 107 electrically couples, respectively, with an electrical contact (not shown) on the bottom of the memory module 108. Each of the BGA 107 receives a signal, power, or ground through the package substrate 104. The assignment of each of the BGA 107 may be referred to as a memory module ball map, as discussed further with respect to FIG. 1B.

Figure 1B:
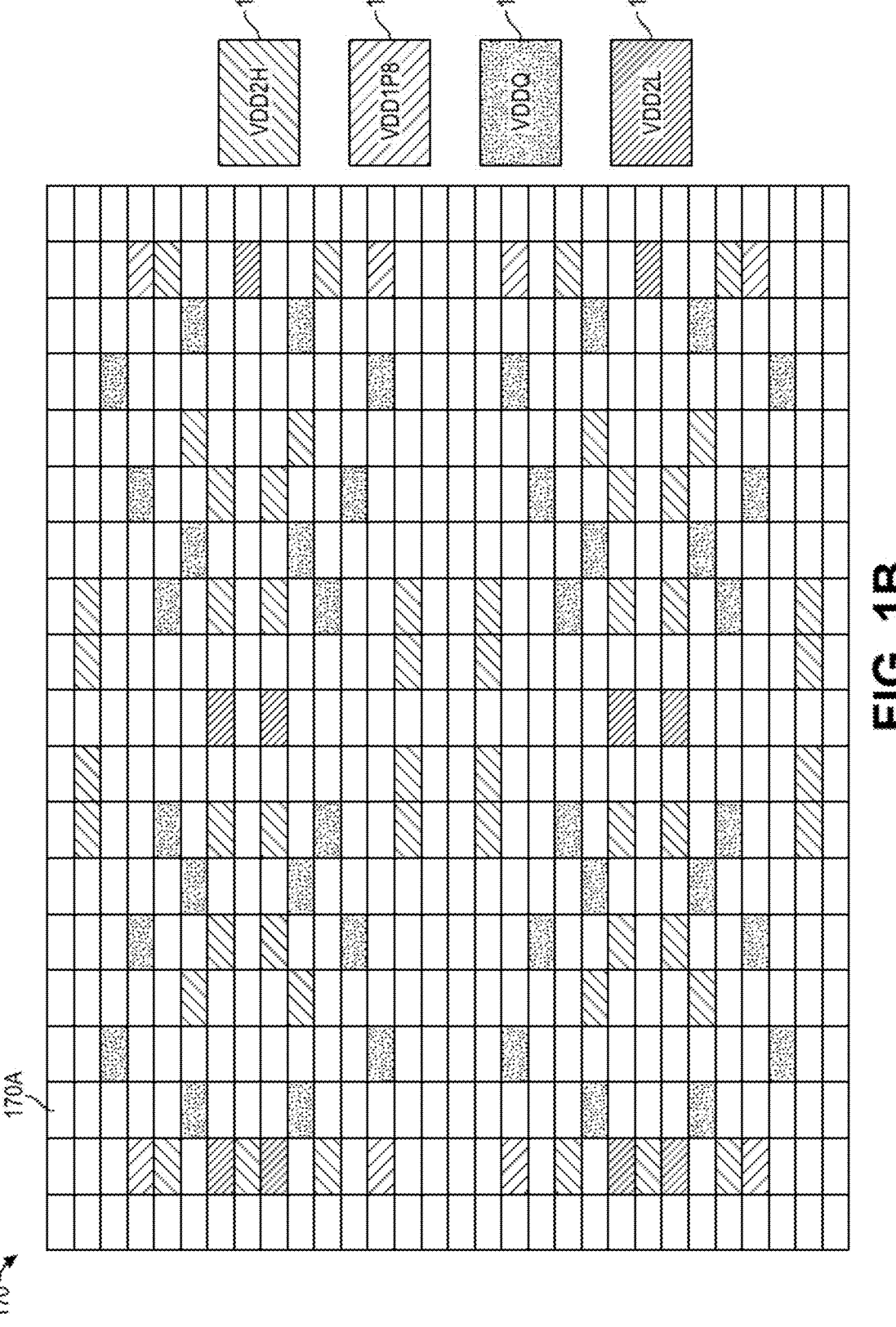

FIG. 1B shows a schematic of a legacy memory module ball map 170, with each cell, such as cell 170a, corresponding to an individual solder ball of the BGA 107 as shown in FIG. 1A. The memory module ball map 170 shows example locations of various power rails VDD2H 172, VDD1p8-MEM 174, VDDQ 176, and VDD2L 178. As shown, the power rails 172, 174, 176, 178 are distributed across the ball map 170, which makes for a more complicated connection pattern through the package substrate 104, and as a result requires additional layers for the package substrate 104.

FIG. 1C shows a diagram 180 of various layers 182 of an implementation of the substrate package 104 that includes various power rails such as power rails within each of the various layers 182. For example, a ground (GND) may be found at layers L01 182a, L03 182c, L05 182e, layer L07 182g and L09 182i. DDR routing 1 is found at layer L02 182b, and DDR Routing 2 is found at layer L04 182d. VDD2H 172 is found at layer L06 182f and L10 182j. VDD1p8 174 is found at layers L06 182f and L10 182j. VDDQ is found at layers L08 182h and L10 182j. VDDQ is found at layer L08 182h and L10 182j.

Figure 1D:
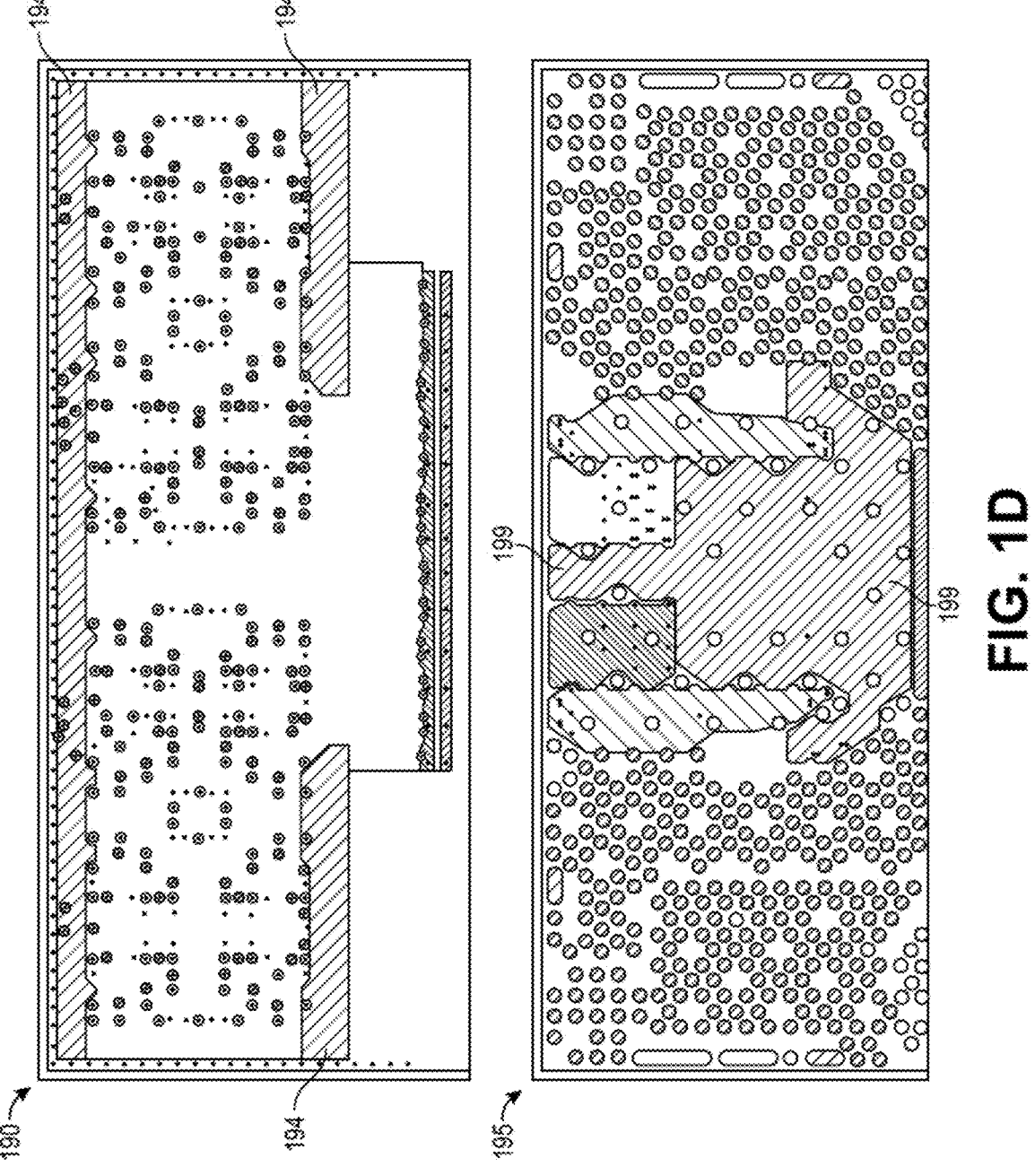

FIG. 1D shows a top-down cross section of two layers of package substrate 104. Layer L06 190, which may be similar to layer L06 182f, includes VDD1P8 plane 194, which may be similar to VDD1P8 174 of FIG. 1B. Layer L10 195, which may be similar to layer L10 182j, includes VDD1P8 plane 199, which may be similar to VDD1P8 174 of FIG. 1B.

Figure 2:
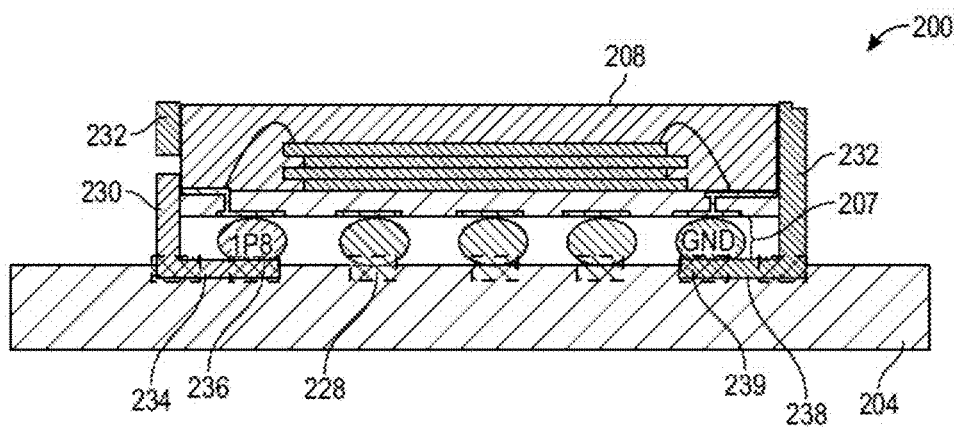
FIG. 2 illustrates a top-down cross section view of a surface of a substrate and a side view of a DRAM module on the substrate with two electrically conductive strips surrounding the DRAM module that are electrically coupled with the substrate, in accordance with various embodiments.

FIG. 2 illustrates a top-down cross section view of a surface of a substrate and a side view of a DRAM module on the substrate with two electrically conductive strips surrounding the DRAM module that are electrically coupled with the substrate, in accordance with various embodiments. Partial memory package 200 includes a memory module 208 that is coupled with a package substrate 204 using BGA 207, which may be similar to memory module 108, BGA 107, and package substrate 104 of FIG. 1. In embodiments, the BGA 207 may couple with one or more electrical contacts 228.

In embodiments, a first electrically conductive strip 230 and a second electrically conductive strip 232, which may also be referred to as rings, may surround or partially surround the memory module 208. In this embodiment, the first electrically conductive strip 230 may be associated with power, and the second electrically conductive strip 232 may be associated with a ground. In embodiments, the first electrically conductive strip 230 and/or the second electrical conductive strip 232 may extend from the side of the memory module 208 down to a surface of the package substrate 204, where it may then be electrically coupled by electrical connection 238 with one of the plurality of electrical contacts 239 on the surface of the package substrate 204 that may correspond to the layout of the BGA 207.

In particular, the first electrically conductive strip 230 may be electrically coupled through an electrical connection 234 to an electrical contact 236 on the package substrate 204. When the partial memory package 200 is in operation, the entire first electrically conductive strip 230 will be at the same electrical voltage as the electrical contact 236, in this case at the VDD1P8 voltage, which may be similar to VDD1P8 174 voltage of FIG. 1B.

Partial package 200 shows an example where electrical contact 236 connects with a solder ball at an edge of a BGA 207. In other embodiments, another solder ball (not shown) may be in an interior position of the BGA 207. In these embodiments, the electrical connection 234 may be at a lower layer of package substrate 204, and vias or micro vias (not shown) may be used to electrically couple the electrical connection 234 with the other solder ball (not shown). In these embodiments, any intervening solder balls (not shown) between the other solder ball and the edge of the BGA 207 may still remain active.

Figure 3:
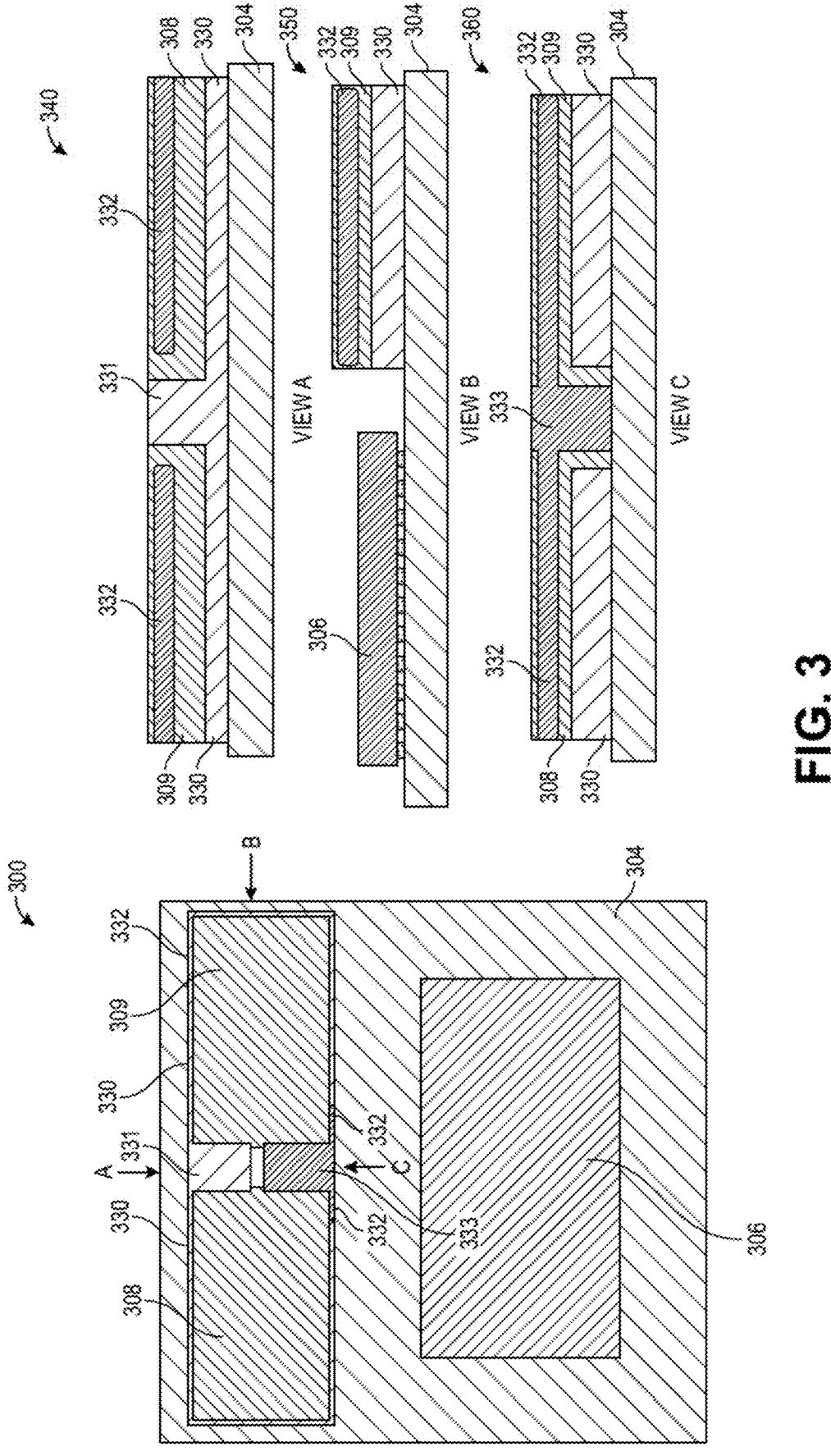
FIG. 3 illustrates a top-down and cross section side views of a package that includes two DRAM modules coupled with a substrate, with two electrically conductive strips surrounding the DRAM modules, in accordance with various embodiments.

FIG. 3 illustrates a top-down and cross section side views of a package that includes two DRAM modules coupled with a substrate, with two electrically conductive strips surrounding the DRAM modules, in accordance with various embodiments. FIG. 3 shows various configurations of the techniques described with respect to FIG. 2 for memory packages.

Diagram 300 shows a top-down view of a die 306 on a package substrate 304, with two memory modules 308, 309, that are coupled to the package substrate 304. A first electrically conductive strip 330 at least partially surrounds the memory modules 308, 309, and a second electrically conductive strip 332 at least partially surrounds the memory modules 308, 309. In embodiments, the die 306, package substrate 304, memory modules 308, 309, first electrically conductive strip 330 and second electrically conductive strip 332 may be similar to die 106 of FIG. 1A, package substrate 204, memory module 208, first electrically conductive strip 230 and second electrically conductive strip 232 of FIG. 2.

In embodiments, a first electrically conductive bridge 331 may electrically couple the first electrically conductive strips 330 around at least a portion of the two memory modules 308, 309. A second electrically conductive bridge 333 may electrically couple the second electrically conductive strips 332 around at least a portion of the two memory modules 308, 309. In embodiments, the first electrically conductive bridge 331 and/or the second electrically conductive bridge 333 may be electrically coupled with the package substrate 304 in a manner similar to that as shown in FIG. 2. The first electrically conductive bridge 331 and the second electrically conductive bridge 333 may be electrically isolated from each other.

Diagram 340 shows a side view from direction A of diagram 300. The second electrically conductive strip 332, which may be a ground, is on the side of the memory modules 308, 309, and positioned above the first electrically conductive strip 330, which may provide power. The first electrically conductive bridge 331 is electrically coupled with the sections of the first electrically conductive strips 330 that are attached to the side of the memory modules 308, 309. The electrically conductive strips 330 may be electrically coupled with the package substrate 304, for example to a power contact (not shown), but which may be similar to electrical contact 236 of FIG. 2.

Diagram 350 shows a side view from direction B of diagram 300. The die 306 and the memory module 309 are coupled with the substrate 304. The second electrically conductive strip 332 is shown on the side of the memory module 309 and above the first electrically conductive strip 330, also on the side of the memory module 309. In embodiments, the first electrically conductive strip 330 may be physically and/or electrically coupled with the substrate 304.

Diagram 360 shows a side view from direction C of diagram 300. The second electrically conductive strip 332 extends along a top side of the memory modules 308, 309, and is electrically coupled with a second electrically conductive bridge 333, which is coupled with the package substrate 304. The first electrically conductive strip 330, which is below the second electrically conductive strip 332, is electrically isolated from the second electrically conductive strip 332 and maybe coupled with the package substrate 304.

Figure 4:
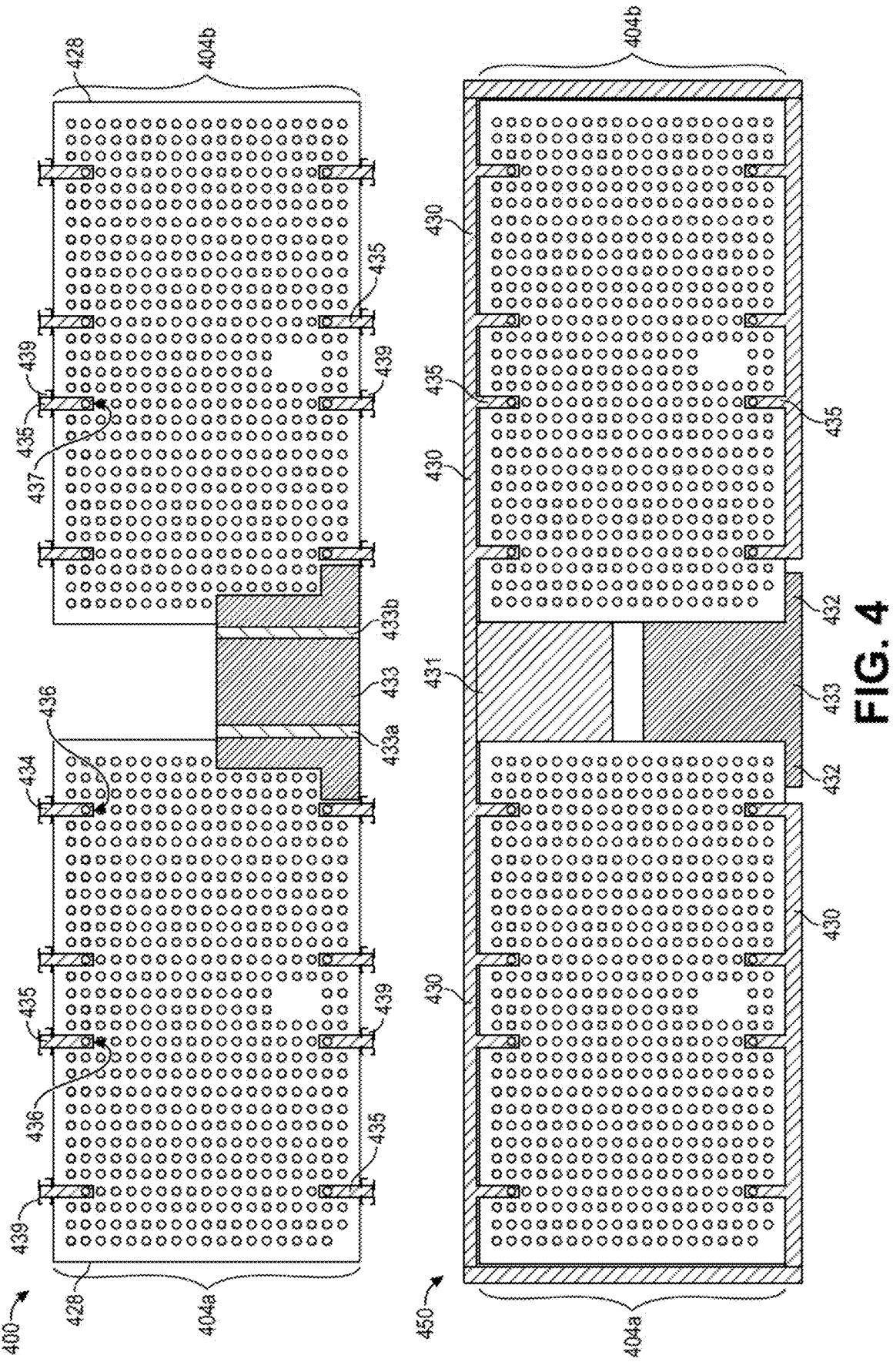
FIG. 4 illustrates various top-down cross section views of bridges to electrically couple electrically conductive strips surrounding two DRAM modules, in accordance with various embodiments.

FIG. 4 illustrates various top-down cross section views of bridges to electrically couple electrically conductive strips surrounding two DRAM modules, in accordance with various embodiments. FIG. 4 includes diagrams that may be similar to the embodiment described with respect to FIG. 3. In particular, diagram 400 shows a first area 404a and a second area 404b on a surface of a substrate such as substrate 304 of FIG. 3. First area 404a and a second area 404b may be areas under memory modules, such as memory modules 308, 309 of FIG. 3.

Electrical connection 434, which may be similar to electrical connection 234 of FIG. 2, may electrically couple with an electrical contact 436, which may be similar to electrical contact 236 of FIG. 2, is on a packaging substrate (not shown), but may be similar to package substrate 204 of FIG. 2. In embodiments, the electrical contact 436 may be a power contact that is able to receive power by way of electrical pathways through the substrate. Other electrical connections 435, which may be on the first area 404a or the second area 404b, are also electrically coupled with one of the electrical contacts 428, which may be similar to electrical contacts 228 of FIG. 2. In embodiments, at an end of each the electrical connections 434, 435 there may be an electrical coupling mechanism 439, which in embodiments may be a solder mask opening, that may be used to electrically couple with an electrically conductive strip, such as electrically conductive strip 430 of diagram 450, or electrically conductive strip 230 of FIG. 2.

In embodiments, an electrically conductive ground bridge 433 may be placed on the surface of the substrate between the first area 404a and the second area 404b. In embodiments, the electrically conductive ground bridge 433 may be similar to the second electrically conductive bridge 333 of FIG. 3. In embodiments, the electrically conductive ground bridge 433 may be electrically coupled with the substrate, or may be electrically coupled with one or more electrical contacts 428. In embodiments, the electrically conductive ground bridge 433 may have features to facilitate direct physical or electrical coupling with one or more electrically conductive strips, such as electrically conductive strip 332 of FIG. 3. In embodiments, these features may include solder mask openings 433a, 433b into which an electrically conductive strip may be inserted.

Diagram 450, which may be similar to diagram 400, includes an electrically conductive power bridge 431, which may be similar to the first electrically conductive bridge 331 of FIG. 3. An electrically conductive power strip 430, which may be similar to first electrically conductive strip 330 of FIG. 3, may surround at least a portion of the first area 404a and the second area 404b and electrically couple with electrical connections 434, 435. In embodiments, the electrically conductive strip 430 may electrically couple with the electrical connections 434, 435 using coupling mechanism 439. Similarly, the electrically conductive ground bridge 433 may be electrically coupled with an electrically conductive ground strip 432.

Figure 5:
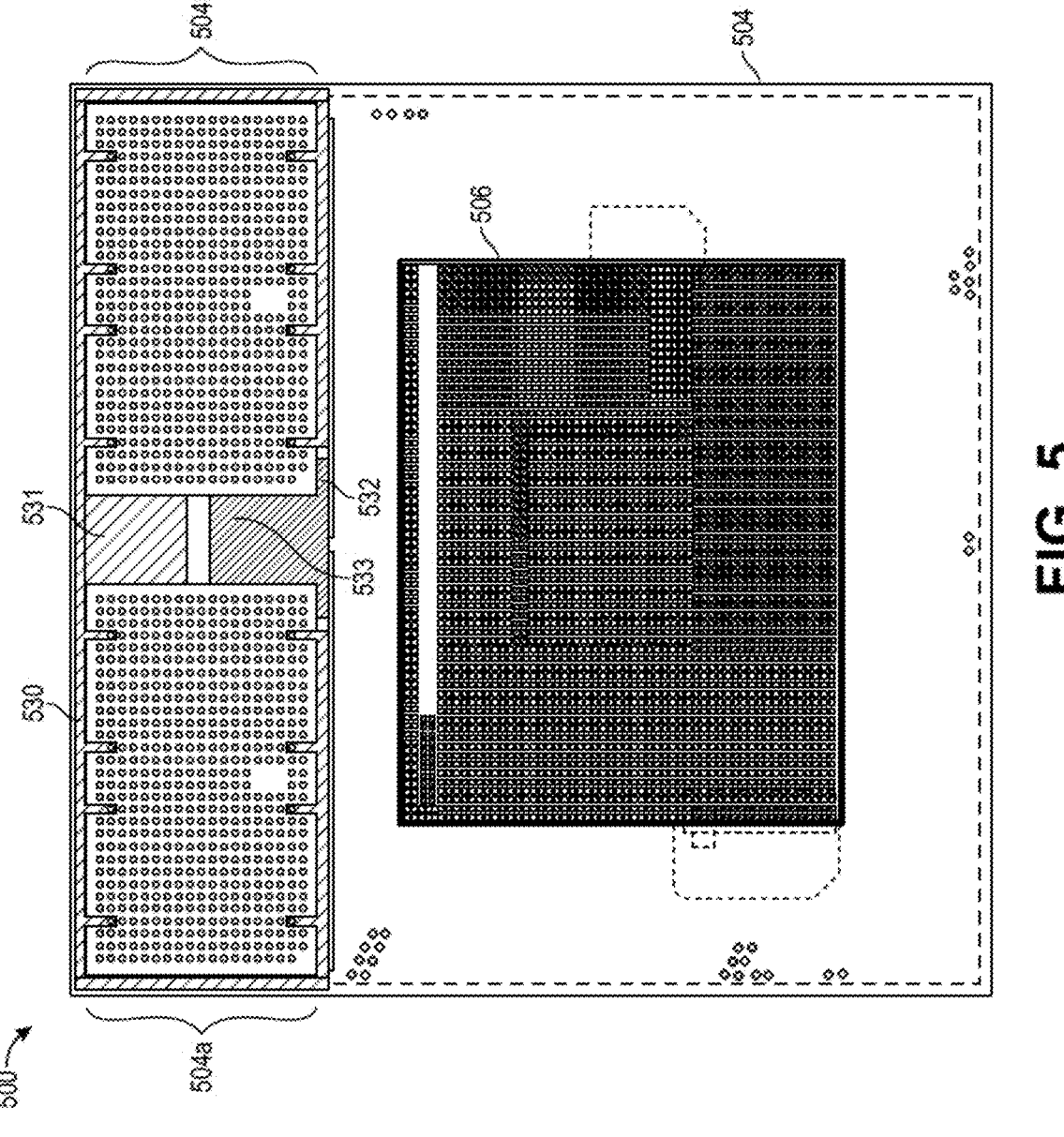
FIG. 5 illustrates a top-down cross section view of a package substrate that includes two areas where two DRAM modules are to be coupled with the substrate with two electrically conductive strips surrounding the DRAM modules, with an area for a die to be coupled on the package substrate, in accordance with various embodiments.

FIG. 5 illustrates a top-down cross section view of a package substrate that includes two areas where two DRAM modules are to be coupled with the substrate with two electrically conductive strips surrounding the DRAM modules, with an area for a die to be coupled on the package substrate, in accordance with various embodiments. Partial package 500, which may be similar to partial package 300 of FIG. 3, shows a top-down cross section schematic view that includes a first electrically conductive strip 530 that is electrically coupled with the substrate 504, and includes a second electrically conductive strip 532 that is also electrically coupled with the substrate 504. These may be similar to the first electrically conductive strip 330 and the second electrically conductive strip 332 of FIG. 3.

The first electrically conductive strip 530 and the second electrically constructive strip 532 at least partially surround first area 504a and second area 504b, which may be similar to first area 404a and second area 404b of FIG. 4, on the substrate 504. The first electrically conductive bridge 531, which may be similar to first electrically conductive bridge 431 of FIG. 4, may be electrically connected with the first electrically conductive strip 530. The second electrically conductive bridge 533, which may be similar to the second electrically conductive bridge 433 of FIG. 4, may be electrically connected with the second electrically conductive strip 532.

The first electrically conductive strip 530 and the second electrically conductive strip 532 may be implemented as vertical metal rings that are coupled with the sides of memory modules (not shown) that may be similar to memory modules 308, 309 of FIG. 3. The first electrically conductive strip 530 and the second electrically conductive strip 532 may be electrically coupled with substrate 504 as described above. Die area 506 on the substrate 504, which may be similar to the area beneath die 306 of FIG. 3, includes various connections on the surface of the substrate 504.

Figure 6:
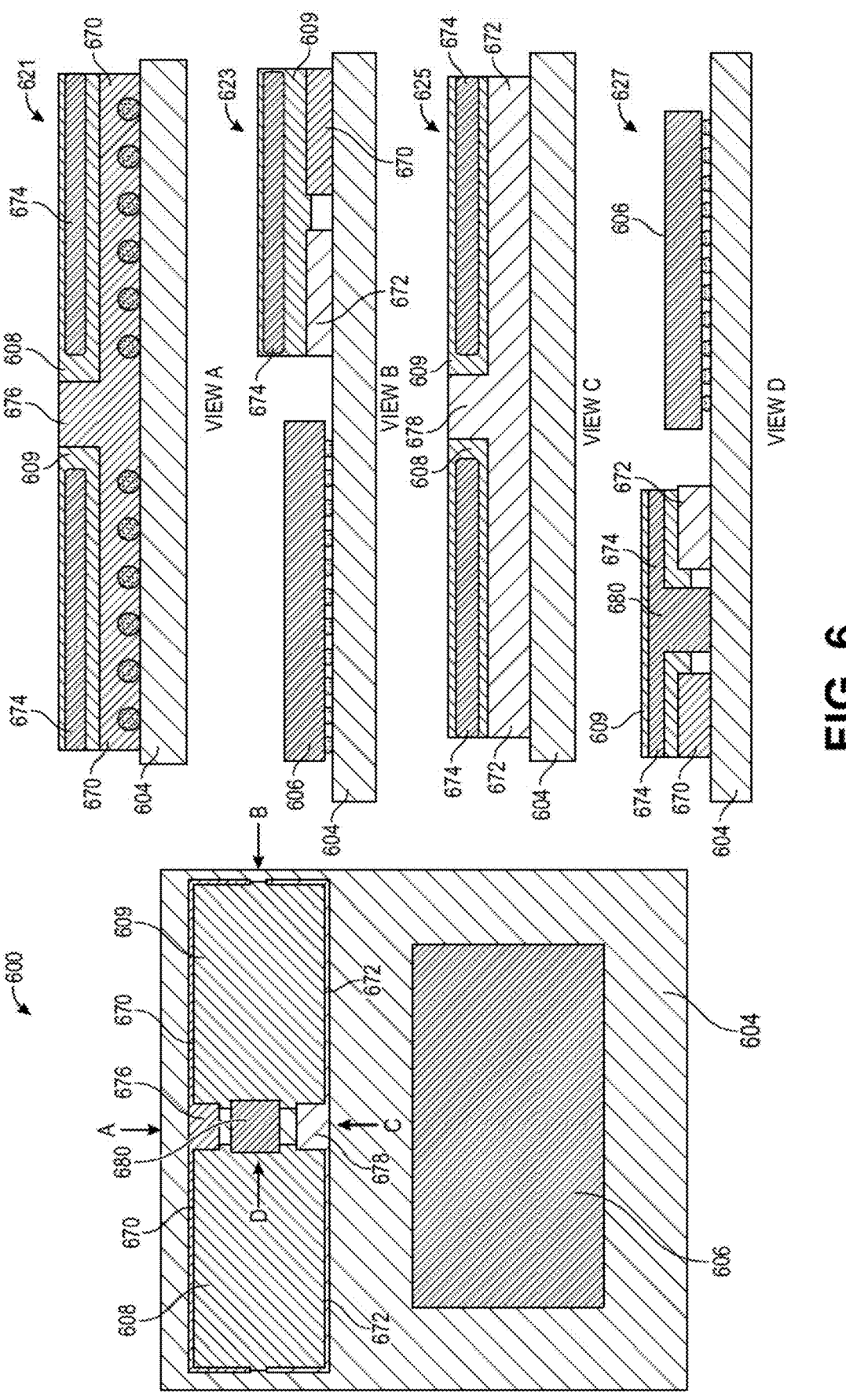
FIG. 6 illustrates a top-down view and cross section side views of a package that includes two DRAM modules coupled with a substrate, with three electrically conductive strips surrounding the DRAM modules, in accordance with various embodiments.

FIG. 6 illustrates a top-down view and cross section side views of a package that includes two DRAM modules coupled with a substrate, with three electrically conductive strips surrounding the DRAM modules, in accordance with various embodiments. Memory package 600 shows a top view that includes two memory modules 608, 609 and a die 606 that are coupled to a substrate 604, which may be similar to memory modules 308, 309, die 306, and substrate 304 of FIG. 3. Diagrams 621, 623, 625, and 627 show views A, B, C, and D, respectively, of memory package 600. Unlike the embodiments described with respect to FIG. 3, where two electrically conductive strips at least partially surrounding memory modules, FIG. 6 describes embodiments that has three electrically conductive strips partially surrounding the two memory modules 608, 609.

In embodiments, a first electrically conductive strip 670, which may be similar to the first electrically conductive strip 330 of FIG. 3, may at least partially surround memory modules 608, 609, and may electrically couple with a first electrically conductive bridge 676, that may be similar to first electrically conductive bridge 331 of FIG. 3. Similarly, a second electrically conductive strip 672 may electrically couple with a second electrically conductive bridge 678. Additionally, a third electrically conductive strip 674 may electrically couple with a third electrically conductive bridge 680. In this embodiment, the first electrically conductive strip 670, second electrically conductive strip 672, and third electrically conductive strip 674 may be associated with different power or grounds of the memory package 600, and may be electrically isolated from each other.

Diagram 621 shows a cross section side view "A" of the package substrate 604 and the memory modules 608, 609 that are coupled with the package substrate 604. The third electrically conductive strip 674, which may be at a ground potential, is wrapped around on a side of the memory modules 608, 609, and electrically isolated from the first electrically conductive strip 670. The first electrically conductive strip 670 may be electrically coupled with first electrically conductive bridge 676. As shown, the first electrically conductive strip 670 may be electrically coupled with the surface of the substrate package 604.

Diagram 623 shows a cross section side view "B" that includes the package substrate 604, a side of the die 606, and a side of the memory module 609. The third electrically conductive strip 674 is wrapped around on a side of the memory module 609, and the first electrically conductive strip 760 and the second electrically conductive strip 672 are also wrapped around on the side of the memory module 609. All three electrically conductive strips are electrically isolated from each other.

Diagram 625 shows a cross section side view "C" that includes the package substrate 604, and a side of the memory modules 608, 609. The third electrically conductive strip 674, which may be at a ground potential, is wrapped around on a side of the memory modules 608, 609, and electrically isolated from the second electrically conductive strip 672, that is coupled with the second electrically conductive bridge 678. As shown, the second electrically conductive strip 672 may be electrically coupled with the surface of the substrate package 604.

Diagram 627 shows a cross section side view "D" that includes the package substrate 604, a side of the die 606, and a side of the memory module 609. The third electrically conductive strip 674 is wrapped around on a side of the memory module 609 and is electrically coupled with the third electrically conductive bridge 680. The first electrically conductive strip 670 and the second electrically conductive strip 672 are also wrapped around on the side of the memory module 609. All three electrically conductive strips are electrically isolated from each other.

FIGS. 7A-7D illustrate stages in the manufacturing process for creating a package that includes a DRAM module with an electrically conductive strip surrounding the DRAM module that is coupled with a substrate, in accordance with various embodiments. The various manufacturing stages described may be performed using the systems, apparatus, processes, and/or techniques described herein, and in particular with respect to FIGS. 1-6.

Figures 7A, 7B, 7C, 7D:
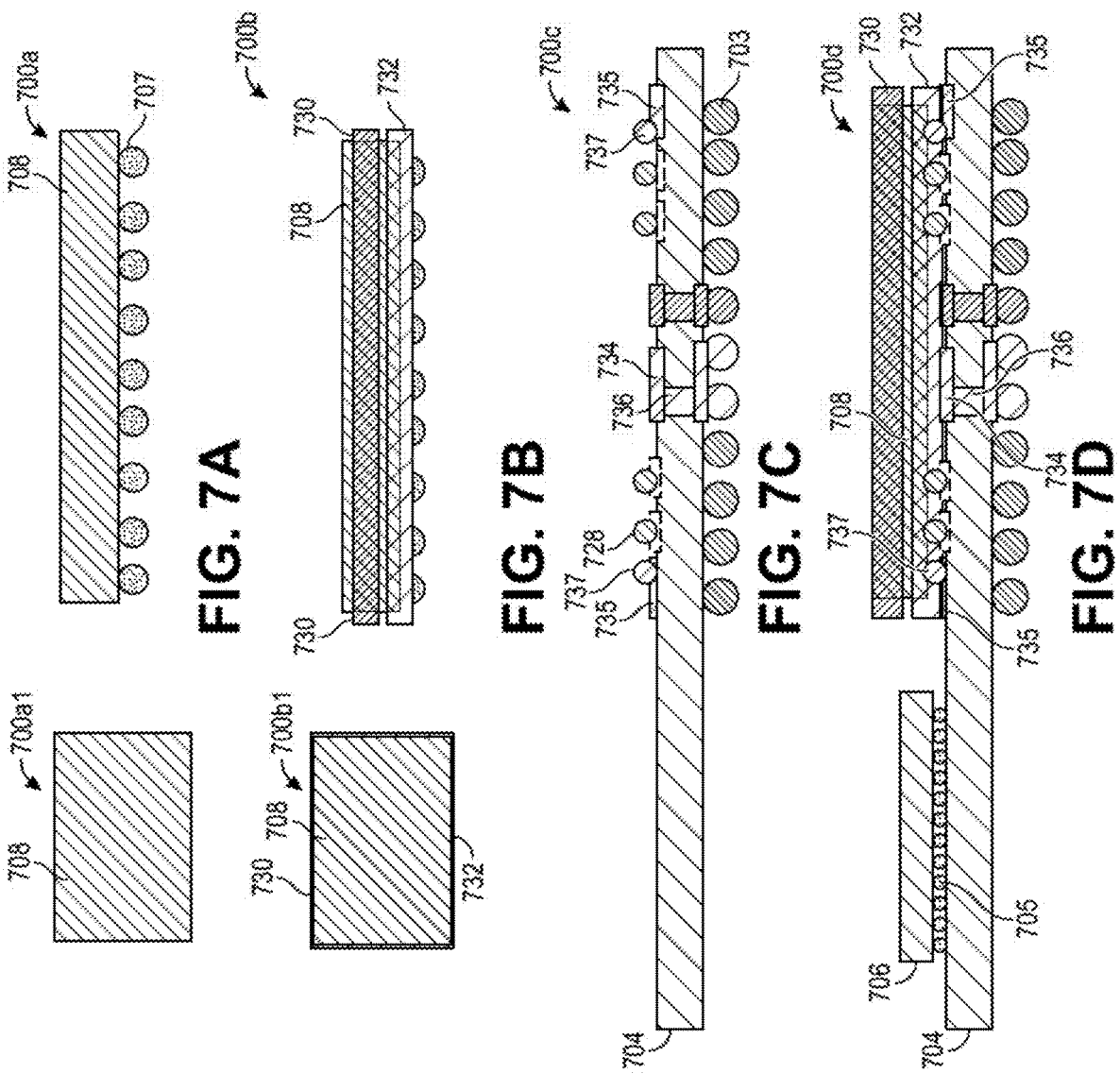
FIGS. 7A-7D illustrate stages in the manufacturing process for creating a package that includes a DRAM module with an electrically conductive strip surrounding the DRAM module that is coupled with a substrate, in accordance with various embodiments.

FIG. 7A shows a top-down view 700a1 and a cross section side view 700a of a stage of the manufacturing process where a memory module 708, which may be similar to memory module 208 of FIG. 2, is provided. In embodiments, the memory module 708 may be a DRAM memory. A BGA 707, which may be similar to BGA 207 of FIG. 2, may be attached to the bottom of the memory module 708.

FIG. 7B shows a top-down view 700*b*1 and a cross section side view 700*b* of a stage of the manufacturing process where a first electrically conductive strip 730 and a second electrically conductive strip 732 are placed on either side of the memory module 708. In embodiments, the first electrically conductive strip 730 and/or the second electrically conductive strip 732 may include, but are not limited to, metal rings or metal tape, such as a copper metal tape. The first electrically conductive strip 730 and the second electrically conductive strip 732, may be similar to electrically conductive strips 630 FIG. 6, and are electrically isolated from each other. In embodiments, an adhesive may be used to adhere the first electrically conductive strip 730 or the second electrically conductive strip 732 to the side of the memory module 708.

FIG. 7C shows a cross section side view 700*c* of a package substrate 704, which may be similar to package substrate 604 of FIG. 6, of a stage of the manufacturing process. A BGA 703 may be placed on a bottom side of the package substrate 704. One or more electrically conductive features, such as a through via 736 and electrical connectors 734, may be placed within or on either surface of the package substrate 704. Additional pads, such as pads 735, and solder balls 728, 737 may also be coupled with the surface of the package substrate 704.

FIG. 7D shows a cross section side view 700*d* of a package substrate 704 of a stage of the manufacturing process, with a die 706, which may be similar to die 606 of FIG. 6, coupled with a side of the package substrate 704 using a BGA 705. The memory module 708 from diagram 700*b* that includes the first electrically conductive strip 730 and the second electrically conductive strip 732 is also coupled with the side of the package substrate 704. As shown, the second electrically conductive strip 732 is electrically coupled with the electrical connectors 734 that provides a voltage or a ground from the through via 736 to the second electrically conductive strip 732. In this way, the second electrically conductive strip 732 is able to provide power to the other electrical connectors 735 that provide power to other solder balls 737 to power the memory module 708 during operation.

Figure 8:
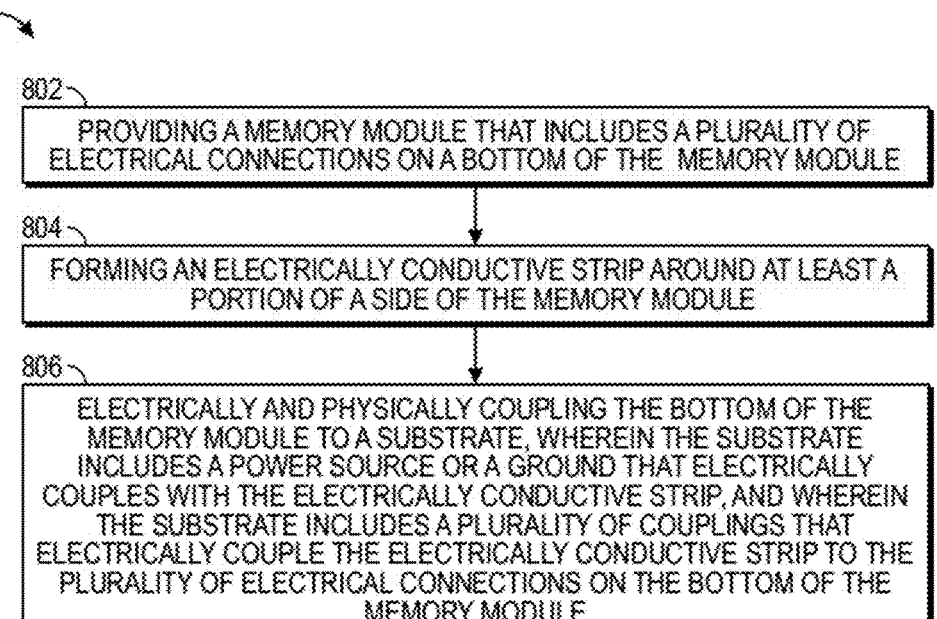
FIG. 8 illustrates an example of a process for creating a package that includes a DRAM module with electrically conductive strip surrounding the DRAM module that is coupled with a substrate, in accordance with various embodiments.

FIG. 8 illustrates an example of a process for creating a package that includes a DRAM module with electrically conductive strip surrounding the DRAM module that is coupled with a substrate, in accordance with various embodiments. Process 800 may be performed by one or more elements, techniques, or systems that may be described herein, and in particular with respect to FIGS. 1-7D.

At block 802, the process may include providing a memory module that includes a plurality of electrical connections on a side of the memory module. In embodiments, the memory module may be similar to memory module 200 of FIG. 2, memory modules 308, 309 of FIG. 3, memory module 608, 609 of FIG. 6 or memory module 708 of FIG. 7.

At block 804, the process may further include forming an electrically conductive strip around at least a portion of the memory module. In embodiments, the electrically conductive strip may be similar to electrically conductive strips 230, 232 of FIG. 2, electrically conductive strips 330, 332 of FIG. 3, electrically conductive strip 430 of FIG. 4, electrically conductive strips 530, 532 of FIG. 5, electrically conductive strips 670, 672, 674 of FIG. 6, or electrically conductive strips 730, 732 of FIGS. 7B-7D.

At block 806, the process may further include electrically and physically coupling the side of the memory module to a substrate, wherein the substrate includes a power source or a ground that electrically couples with the electrically conductive strip, and wherein the substrate includes a plurality of couplings to electrically couple the electrically conductive strip to the plurality of electrical connections on the side of the memory module. In embodiments, the substrate may be similar to the package substrate 204 of FIG. 2, package substrate 304 of FIG. 3, package substrate 604 of FIG. 6, or package substrate 704 of FIGS. 7C-7D.

Figure 9:
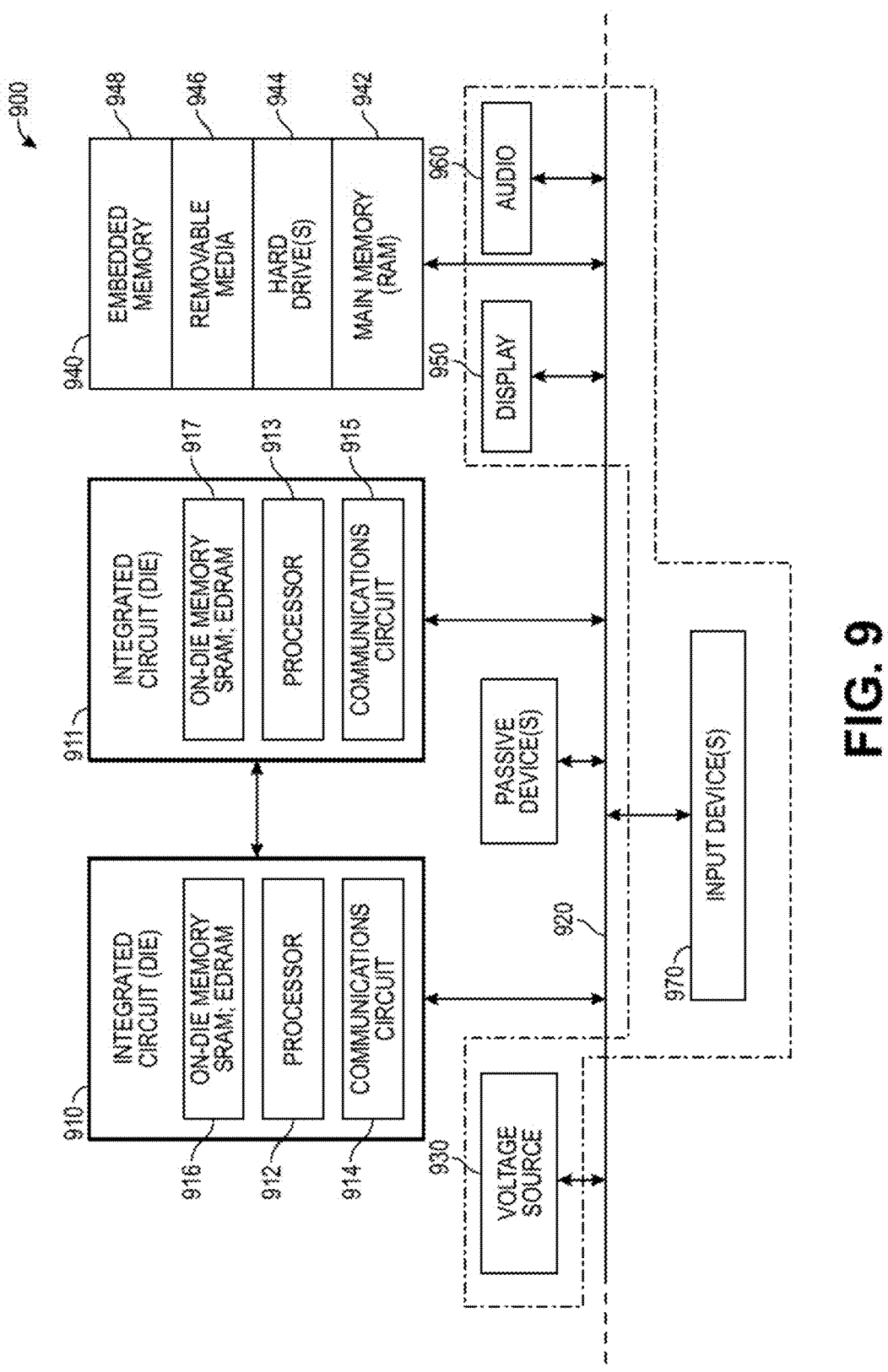
FIG. 9 schematically illustrates a computing device, in accordance with various embodiments.

FIG. 9 is a schematic of a computer system 900, in accordance with an embodiment of the present invention. The computer system 900 (also referred to as the electronic system 900) as depicted can embody electrically conductive strips on a side of a memory module, according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader. The computer system 900 may be a server system. The computer system 900 may be a supercomputer or high-performance computing system.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes, or is coupled with, electrically conductive strips on a side of a memory module, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950, an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including a package substrate having electrically conductive strips on a side of a memory module, according to any of the several disclosed embodiments and their equivalents, an electronic system, a computer system, one or more methods of fabricating an integrated circuit, and one or more methods of fabricating an electronic assembly that includes a package substrate having electrically conductive strips on a side of a memory module, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having electrically conductive strips on a side of a memory module embodiments and their equivalents. A foundation substrate may be included, as represented by the dashed line of FIG. 9. Passive devices may also be included, as is also depicted in FIG. 9.

EXAMPLES

The following paragraphs describe examples of various embodiments.

Example 1 is an apparatus comprising: a memory module with a top and a bottom opposite the top; and an electrically conductive strip on a side of the memory module and at least partially surrounding the memory module, the electrically conductive strip between the top and the bottom, wherein the electrically conductive strip is associated with a power or a ground of the memory module.

Example 2 includes the apparatus of example 1, or of any other example or embodiment described herein, wherein the electrically conductive strip is a selected one of: a metal or a metal tape.

Example 3 includes the apparatus of example 1, or of any other example or embodiment described herein, wherein the memory module is a dynamic random-access memory (DRAM) module.

Example 4 includes the apparatus of example 1, or of any other example or embodiment described herein, wherein a width of the electrically conductive strip extends from the top to the bottom of the memory module.

Example 5 includes the apparatus of example 1, or of any other example or embodiment described herein, wherein a thickness of the electrically conductive strip includes copper.

Example 6 includes the apparatus of example 1, or of any other example or embodiment described herein, further comprising an adhesive to couple the electrically conductive strip with the side of the memory module.

Example 7 includes the apparatus of example 1, or of any other example or embodiment described herein, wherein the electrically conductive strip is a first electrically conductive strip; and further comprising: a second electrically conductive strip between the top and the bottom of the memory module; and wherein the first electrically conductive strip is electrically isolated from the second electrically conductive strip.

Example 8 includes the apparatus of example 7, or of any other example or embodiment described herein, wherein at least a portion of the first electrically conductive strip is below at least a portion of the second electrically conductive strip.

Example 9 includes the apparatus of example 7, or of any other example or embodiment described herein, wherein the first electrically conductive strip is associated with a power, and wherein the second electrically conductive strip is associated with a ground.

Example 10 includes the apparatus of example 1, or of any other example or embodiment described herein, wherein the memory module is a first memory module, and wherein the electrically conductive strip is a first electrically conductive strip; and further comprising: a second memory module with a top and a bottom opposite the top; a second electrically conductive strip on a side of the second memory module between the top and the bottom of the second memory module; and an electrically conductive bridge that electrically couples the first electrically conductive strip with the second electrically conductive strip.

Example 11 includes the apparatus of example 10, or of any other example or embodiment described herein, wherein the electrically conductive bridge includes a metal.

Example 12 is a package comprising: a substrate; a memory module with a top and a bottom opposite the top, wherein the memory module includes one or more electrical connections, and wherein the one or more electrical connections are electrically coupled with the substrate; and an electrically conductive strip on a side of the memory module, the electrically conductive strip between the top and the bottom, wherein the electrically conductive strip is electrically coupled with the one or more electrical connections.

Example 13 includes the package of example 12, or of any other example or embodiment described herein, wherein the one or more electrical connections are at a bottom of the memory module.

Example 14 includes the package of example 13, or of any other example or embodiment described herein, wherein the one or more electrical connections are associated with a power or a ground of the memory module.

Example 15 includes the package of example 13, or of any other example or embodiment described herein, wherein the one or more electrical connections are electrically coupled with one or more solder balls on the memory module.

Example 16 includes the package of example 12, or of any other example or embodiment described herein, wherein the electrically conductive strip is a first electrically conductive strip, and wherein the one or more electrical connections is a first set of one or more electrical connections; and further comprising: a second electrically conductive strip on the side of the memory module that is electrically isolated from the first electrically conductive strip; and a second set of one or more electrical connections included in the memory module, wherein the second set of one or more electrical connections are electrically coupled with the substrate and with the second electrically conductive strip.

Example 17 includes the package of example 16, or of any other example or embodiment described herein, wherein the first electrically conductive strip is associated with a power source, and the second electrically conductive strip is associated with a ground.

Example 18 includes the package of example 12, or of any other example or embodiment described herein, wherein the memory module is a first memory module, wherein the electrically conductive strip is a first electrically conductive strip, and wherein the one or more electrical connections are a first set of one or more electrical connections; and further comprising: a second memory module on the substrate; a second electrically conductive strip on a side of the second memory module, wherein the second electrically conductive strip is electrically coupled with a second set of one or more electrical connections on the second memory module.

Example 19 includes the package of example 18, or of any other example or embodiment described herein, wherein the first electrically conductive strip is electrically coupled with the second electrically conductive strip.

Example 20 includes the package of example 19, or of any other example or embodiment described herein, further comprising a connector electrically and physically coupled with the substrate and electrically coupled with the first electrically conductive strip and the second electrically constructive strip.

Example 21 includes the package of example 12, or of any other example or embodiment described herein, further comprising one or more dies on the substrate, wherein the one or more dies are electrically coupled with the memory module.

Example 22 is a method comprising: providing a memory module that includes a plurality of electrical connections on a bottom of the memory module; forming an electrically conductive strip around at least a portion of a side of the memory module; and electrically and physically coupling the bottom of the memory module to a substrate, wherein the substrate includes a power source or a ground that electrically couples with the electrically conductive strip, and wherein the substrate includes a plurality of couplings that electrically couple the electrically conductive strip to the plurality of electrical connections on the bottom of the memory module.

Example 23 includes the method of example 22, or of any other example or embodiment described herein, wherein the electrically conductive strip is a copper tape.

Example 24 includes the method of example 22, or of any other example or embodiment described herein, wherein the plurality of electrical connections include solder balls.

Example 25 includes the method of example 22, or of any other example or embodiment described herein, wherein the plurality of couplings include a plurality of copper strips.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
   a memory module with a top and a bottom opposite the top, and a first sidewall and a second sidewall between the top and the bottom, the first sidewall laterally opposite the second sidewall;
   a first electrically conductive strip on the first sidewall of the memory module and at least partially surrounding the memory module, the first electrically conductive strip between the top and the bottom, wherein the first electrically conductive strip is associated with a power or a ground of the memory module; and
   a second electrically conductive strip on the second sidewall of the memory module, the second electrically conductive strip between the top and the bottom, wherein the second electrically conductive strip is associated with the other one of the power or the ground of the memory module.

2. The apparatus of claim 1, wherein the first electrically conductive strip is a selected one of: a metal or a metal tape.

3. The apparatus of claim 1, wherein the memory module is a dynamic random-access memory (DRAM) module.

4. The apparatus of claim 1, wherein a width of the first electrically conductive strip extends from the top to the bottom of the memory module.

5. The apparatus of claim 1, wherein a thickness of the first electrically conductive strip includes copper.

6. The apparatus of claim 1, further comprising an adhesive to couple the first electrically conductive strip with the first sidewall of the memory module.

7. The apparatus of claim 1, wherein
   the first electrically conductive strip is electrically isolated from the second electrically conductive strip.

8. The apparatus of claim 7, wherein at least a portion of the second electrically conductive strip is below at least a portion of the first electrically conductive strip.

9. The apparatus of claim 7, wherein the second electrically conductive strip is associated with the power, and wherein the first electrically conductive strip is associated with a ground.

10. The apparatus of claim 1, wherein the memory module is a first memory module, and further comprising:
    a second memory module with a top and a bottom opposite the top;
    a third electrically conductive strip on a side of the second memory module between the top and the bottom of the second memory module; and an electrically conductive bridge that electrically couples the first electrically conductive strip with the third electrically conductive strip.

11. The apparatus of claim 10, wherein the electrically conductive bridge includes a metal.

12. A package comprising:

a substrate;

a memory module with a top and a bottom opposite the top, and a first sidewall and a second sidewall between the top and the bottom, the first sidewall laterally opposite the second sidewall, wherein the memory module includes one or more electrical connections, and wherein the one or more electrical connections are electrically coupled with the substrate;

a first electrically conductive strip on the first sidewall of the memory module, the first electrically conductive strip between the top and the bottom, wherein the first electrically conductive strip is electrically coupled with the one or more electrical connections; and a second electrically conductive strip on the second sidewall of the memory module, the second electrically conductive strip between the top and the bottom, wherein the second electrically conductive strip is electrically coupled with the one or more electrical connections.

13. The package of claim 12, wherein the one or more electrical connections are at a bottom of the memory module.

14. The package of claim 13, wherein the one or more electrical connections are associated with a power or a ground of the memory module.

15. The package of claim 13, wherein the one or more electrical connections are electrically coupled with one or more solder balls on the memory module.

16. The package of claim 12, wherein the
second electrically conductive strip is electrically isolated from the first electrically conductive strip; and the package further comprising:

a second set of one or more electrical connections included in the memory module, wherein the second set of one or more electrical connections are electrically coupled with the substrate and with the second electrically conductive strip.

17. The package of claim 16, wherein the first electrically conductive strip is associated with a power source, and the second electrically conductive strip is associated with a ground.

18. The package of claim 12, wherein the memory module is a first memory module, and wherein the one or more electrical connections are a first set of one or more electrical connections; and further comprising:

a second memory module on the substrate;

a third electrically conductive strip on a side of the second memory module, wherein the third electrically conductive strip is electrically coupled with a second set of one or more electrical connections on the second memory module.

19. The package of claim 18, wherein the first electrically conductive strip is electrically coupled with the third electrically conductive strip.

20. The package of claim 19, further comprising a connector electrically and physically coupled with the substrate and electrically coupled with the first electrically conductive strip and the third electrically constructive strip.

21. The package of claim 12, further comprising one or more dies on the substrate, wherein the one or more dies are electrically coupled with the memory module.

22. A method comprising:

providing a memory module that includes a plurality of electrical connections on a bottom of the memory module, the bottom opposite a top, and the memory module having a first sidewall and a second sidewall between the top and the bottom, the first sidewall laterally opposite the second sidewall;

forming a first electrically conductive strip around at least a portion of the first sidewall of the memory module between the top and the bottom;

electrically and physically coupling the bottom of the memory module to a substrate, wherein the substrate includes a power source or a ground that electrically couples with the first electrically conductive strip, and wherein the substrate includes a plurality of couplings that electrically couple the first electrically conductive strip to the plurality of electrical connections on the bottom of the memory module; and forming a second electrically conductive strip on the second sidewall of the memory module, the second electrically conductive strip between the top and the bottom, wherein the second electrically conductive strip is associated with the other one of the power source or the ground.

23. The method of claim 22, wherein the first electrically conductive strip is a copper tape.

24. The method of claim 22, wherein the plurality of electrical connections include solder balls.

25. The method of claim 22, wherein the plurality of couplings include a plurality of copper strips.

* * * * *